United States Patent [19]
Osborne

[11] Patent Number: 5,961,739
[45] Date of Patent: Oct. 5, 1999

[54] HEMISPHERIC MOVING FOCUS POWER PLANT APPARATUS AND METHOD

[76] Inventor: Michael J. Osborne, 900 W. 23rd St., Austin, Tex. 78705

[21] Appl. No.: 08/914,470

[22] Filed: Aug. 19, 1997

[51] Int. Cl.⁶ .............................. H01L 31/052; F24J 2/38; F24J 2/12
[52] U.S. Cl. .......................... 136/246; 136/291; 126/600; 126/573; 126/690
[58] Field of Search .................................. 136/244, 246, 136/291; 126/600, 605, 603

[56] References Cited

U.S. PATENT DOCUMENTS

| | | | |
|---|---|---|---|
| 797,891 | 8/1905 | Himalya . | |
| 3,179,105 | 4/1965 | Falbel | 126/271 |
| 3,884,217 | 5/1975 | Wartes | 126/270 |
| 3,905,352 | 9/1975 | Jahn | 126/270 |
| 4,015,585 | 4/1977 | Fattor | 126/271 |
| 4,031,385 | 6/1977 | Zerlaut et al. | 250/203 |
| 4,044,753 | 8/1977 | Fletcher | 126/271 |
| 4,111,184 | 9/1978 | Perkins | 126/270 |
| 4,129,360 | 12/1978 | Deflandre et al. | 350/289 |
| 4,132,219 | 1/1979 | Cohen at al. | 126/270 |
| 4,168,696 | 9/1979 | Kelly | 126/438 |
| 4,170,985 | 10/1979 | Authier | 126/424 |
| 4,177,795 | 12/1979 | Schultz | 126/419 |
| 4,191,164 | 3/1980 | Kelly | 126/439 |
| 4,202,715 | 5/1980 | Ziemba | 156/71 |
| 4,203,426 | 5/1980 | Matlock et al. | 126/425 |
| 4,217,147 | 8/1980 | Ziemba | 136/89 |
| 4,235,224 | 11/1980 | Yarwood | 126/438 |
| 4,238,417 | 12/1980 | Himes | 250/203 |
| 4,287,880 | 9/1981 | Geppert | 126/439 |
| 4,341,607 | 7/1982 | Tison | 204/129 |
| 4,350,143 | 9/1982 | Laing | 126/415 |
| 4,408,595 | 10/1983 | Broyles | 126/424 |
| 4,551,980 | 11/1985 | Bronicki | 60/698 |
| 4,594,470 | 6/1986 | Headrick | 136/246 |
| 4,668,841 | 5/1987 | Headrick | 136/246 |
| 5,253,637 | 10/1993 | Maiden | 126/696 |

FOREIGN PATENT DOCUMENTS

| | | |
|---|---|---|
| 986969 | 8/1951 | France . |
| 3003962A1 | 8/1981 | Germany . |
| 1081389 | 5/1984 | U.S.S.R. . |

OTHER PUBLICATIONS

"Solar Cell Array Design Handbook" by H. S. Rauschenbach, pp. 178–179, 1980.

Primary Examiner—Nam Nguyen
Assistant Examiner—Michael C. Miggins
Attorney, Agent, or Firm—J. Nevin Shaffer, Jr.; Shaffer & Culbertson, LLP

[57] ABSTRACT

A hemispheric moving focus power plant (10) has a hemispheric solar reflector (12) for reflecting solar energy. A receiver (14) for receiving reflected solar energy and producing power therefrom is movably connected to the hemispheric solar reflector (12). The receiver (14) includes a frame with a top (24), to which a plurality of photovoltaic cells are connected, and a support (26). Further, a power conditioner (16) is connected to the receiver (14) for receiving power from the receiver (14) and conditioning the power for use.

17 Claims, 8 Drawing Sheets

AXIAL RAYS   PARAXIAL RAYS

MIRROR REFLECTING SURFACE

RECIEVER

AXIAL RAYS   PARAXIAL RAYS

MIRROR REFLECTING SURFACE

RECIEVER

HEMISPHERIC MOVING FOCUS POWER PLANT APPARATUS AND METHOD

BACKGROUND OF THE INVENTION

This invention relates to an improved hemispheric moving focus power plant for producing power. In particular, this invention relates to a hemispheric moving focus power plant for producing power from solar energy.

Man's search for an inexpensive renewable energy source is ongoing and age old. In particular, during the early seventies, as the United States was adjusting to oil price shocks, research into solar energy accelerated in hopes of finding technology that could replace usable energy at practical prices. One such project, of which the inventor is aware, was the "Crosbyton" project in the city of Crosbyton, Tex. This project resulted in the development of an out of ground tilted solar reflector for reflecting solar energy to a cylindrically shaped receiver that was hung over the reflector by means of an expensive derrick device. The project required the use of high quality optics and high quality mirrors. Other reflectors have been built which were not tilted and which include receivers that are movable to receive direct and reflected solar energy. An example of such a device is disclosed in Authier, U.S. Pat. No. 4,170,985. In general, prior art devices receive energy from both north and south quadrants, as in Authier, and therefore, are typically tilted to the south. Tilting, as in the Crosbyton project and others, adds expense and increases the difficulty of using the device and results in energy graphs that fluctuate wildly as the sun crosses the sky. Additionally, the receiver of prior art devices is typically a linear cylinder which has essentially one hot spot at its midpoint where the majority of the reflected energy contacts the receiver making it extraordinarily hot at a single point. Thirdly, prior art technology requires high quality optics and, therefore, is extrodinarily expensive. Further, prior art devices focus primarily on thermal technology, oil, water and the like, for heat transfer. Such technology requires high quality optics to generate the heat necessary to drive the system and such thermal devices are difficult to maintain and repair.

Thus, there is a need in the art for providing a power plant apparatus and method that is an alternative to thermal technology, that does not require above ground tilted construction, that utilizes a receiver that receives energy across a broad area and is not focused at a single hot spot, that enables energy to be received from a single quadrant only while discarding other quadrants and that utilizes "fuzzy" low cost optics versus high quality optics. It, therefore, is an object of this invention to provide an improved hemispheric moving focus power plant apparatus and method for providing power which is simple in construction, inexpensive and reliable.

SHORT STATEMENT OF THE INVENTION

Accordingly, the hemispheric moving focus power plant apparatus of the present invention includes a hemispheric solar reflector using fuzzy optics for reflecting solar energy. A receiver means for receiving reflected solar energy and producing power therefrom is movably connected to the hemispheric solar reflector. The receiver means includes a frame with a top to which photovoltaic cells are connected. A support section supports the top. In a preferred embodiment a base is connected to the support wherein the base includes reflective mirrors and the support also includes photovoltaic cells for receiving solar energy. Additionally, a power conditioner device is connected to the receiver for receiving power from the receiver and conditioning the power for use. By means of the present invention, therefore, expensive derricks for suspending hot spot cylindrical receivers above expensive high quality mirrors are eliminated. Instead, the receiver of the present invention is movable about and in and out of the hemispheric solar reflector so as to capture solar rays efficiently throughout the day. As a result, the wild fluctuations of prior art devices are eliminated and a dependable flat source of energy is created. In a preferred embodiment the receiver is in the shape of a block "C" with an upper, middle, and bottom section. The upper section is in a shape of an anvil and the upper and bottom sections are angled away from the middle section. Also, the upper and middle sections are covered with a plurality of photovoltaic cells. The bottom section is mirrored so as to reflect solar rays onto the upper and middle sections. Further, in a preferred embodiment a guidance system for controllably moving the receiver around the hemispheric solar reflector and up and down the reflective surface of the hemispheric solar reflector is provided. Additionally, in a preferred embodiment a water collection system is provided for directing rain water collected in the hemispheric solar reflector for reuse.

A corresponding method of the invention is also provided as disclosed and discussed more fully hereafter.

BRIEF DESCRIPTION OF THE DRAWINGS

Other objects, features and advantages of the present invention will become more fully apparent from the following detailed description of the preferred embodiment, the appended claims and the accompanying drawings in which:

DETAILED DESCRIPTION OF A PREFERRED EMBODIMENT OF THE PRESENT INVENTION

Figure 1:
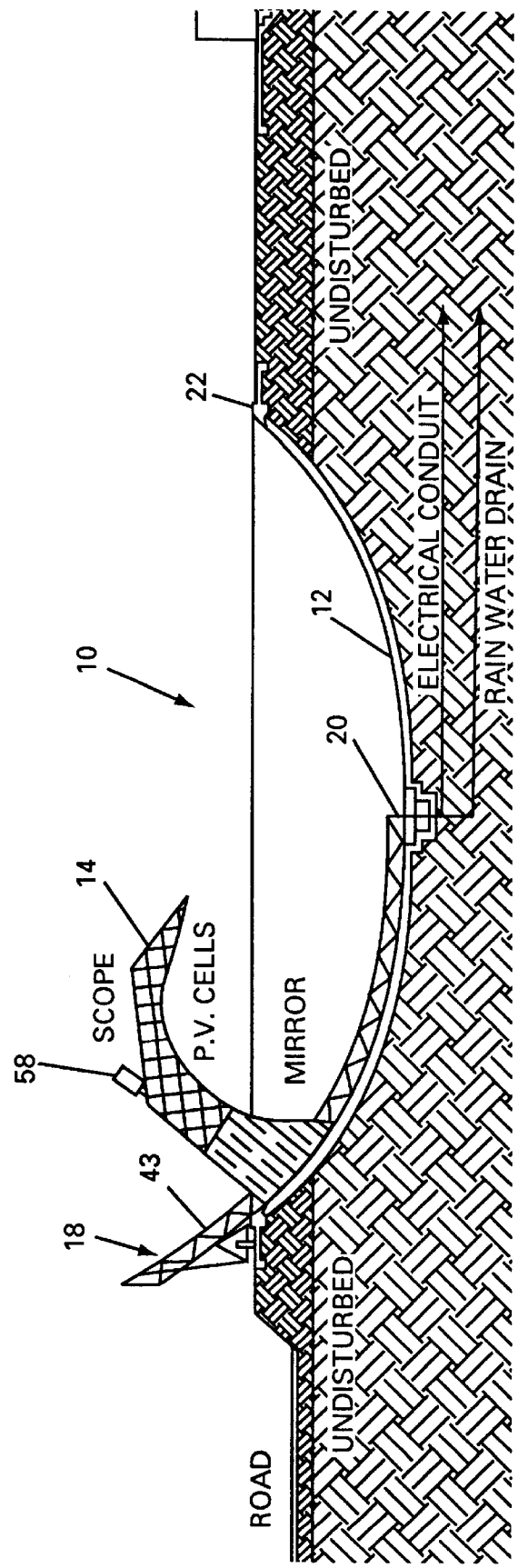
FIG. 1 is a side view of a preferred embodiment of the hemispheric moving focus power plant of the present invention showing the receiver at the top inside of the hemispheric solar reflector.
Figure 2:
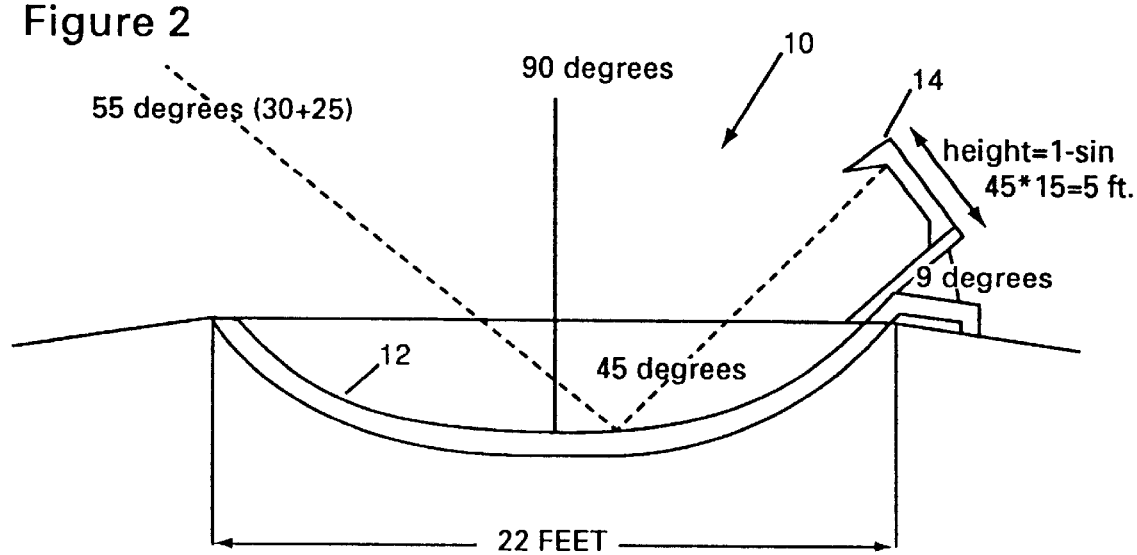
FIG. 2 is a side view showing the receiver of the present invention located above the rim of the hemispheric solar receiver.

The preferred embodiment of the present invention is illustrated by way of example in FIGS. 1–10. With specific reference to FIGS. 1 and 2, the hemispheric moving focus power plant 10 of the present invention includes a hemispheric solar reflector 12 for reflecting solar energy. Receiver 14 receives reflected solar energy from hemispheric solar reflector 12 and produces power therefrom, as more fully described hereafter. A power conditioner 16 (see FIGS. 7, 8 and 9) is connected to the receiver 14 and receives power from the receiver 14 and conditions the power for subsequent use. Also shown in FIG. 1 is guidance system 18, disclosed more fully hereafter, which utilizes pivot point 20 at the nadir of hemispheric solar reflector 12 for guidance of the receiver 14 around the rim 22 of hemispheric solar reflector 12 and into and out of hemispheric solar reflector 12. FIG. 1 illustrates receiver 14 at the top of, and inside, hemispheric solar reflector 12. FIG. 2 illustrates receiver 14 outside of hemispheric solar reflector 12. FIG. 2 also indicates a preferred embodiment of the present invention wherein the hemispheric solar reflector 12 represents ninety degrees of arc. With that conformation, the hemispheric moving focus power plant 10 of the present invention successfully reflects the path of the sun at a location with a thirty degree latitude. Other latitudes require adjustment. When the invention is utilized in higher latitudes, for example, the hemispheric solar reflector 12 of the present invention must be more shallow or the hemispheric solar reflector 12 experiences significant eclipsing during winter months.

Figure 3:
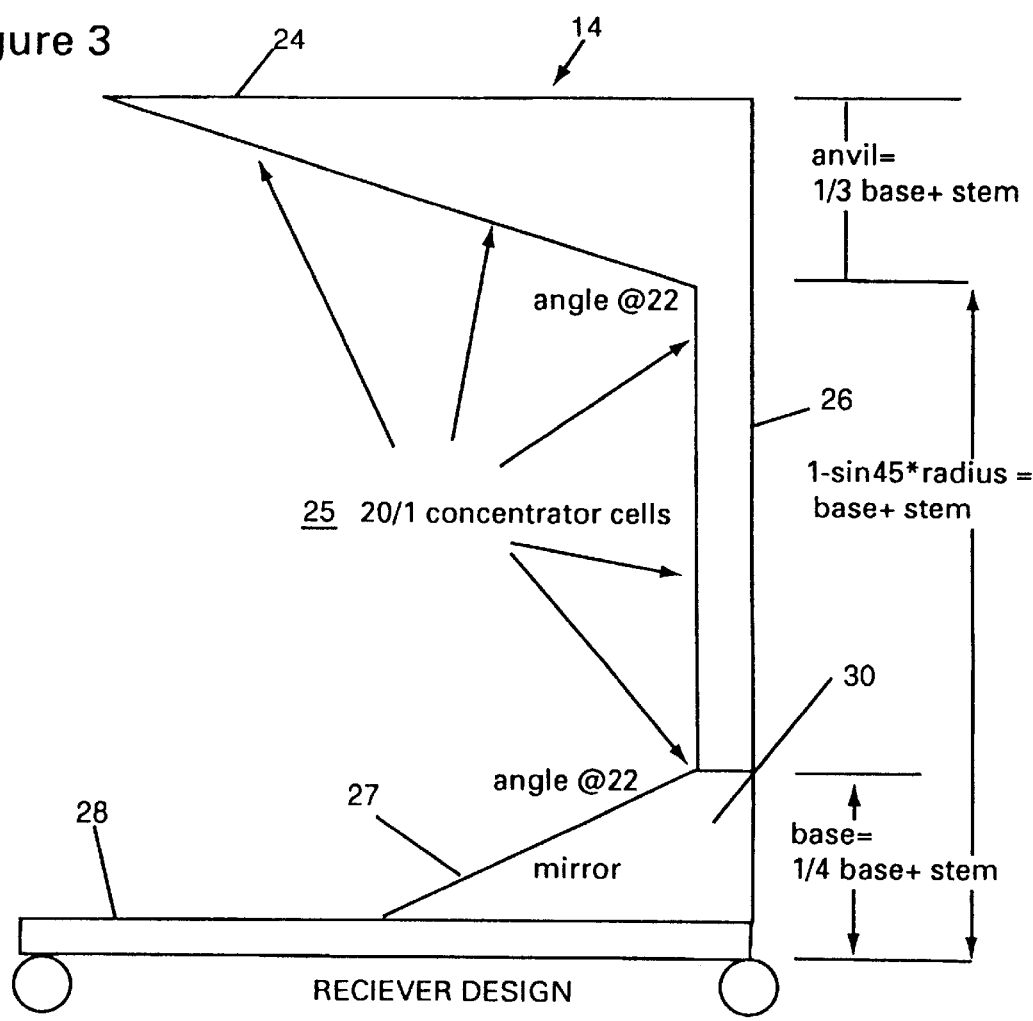
FIG. 3 is a side view of the receiver of the present invention.
Figure 4:
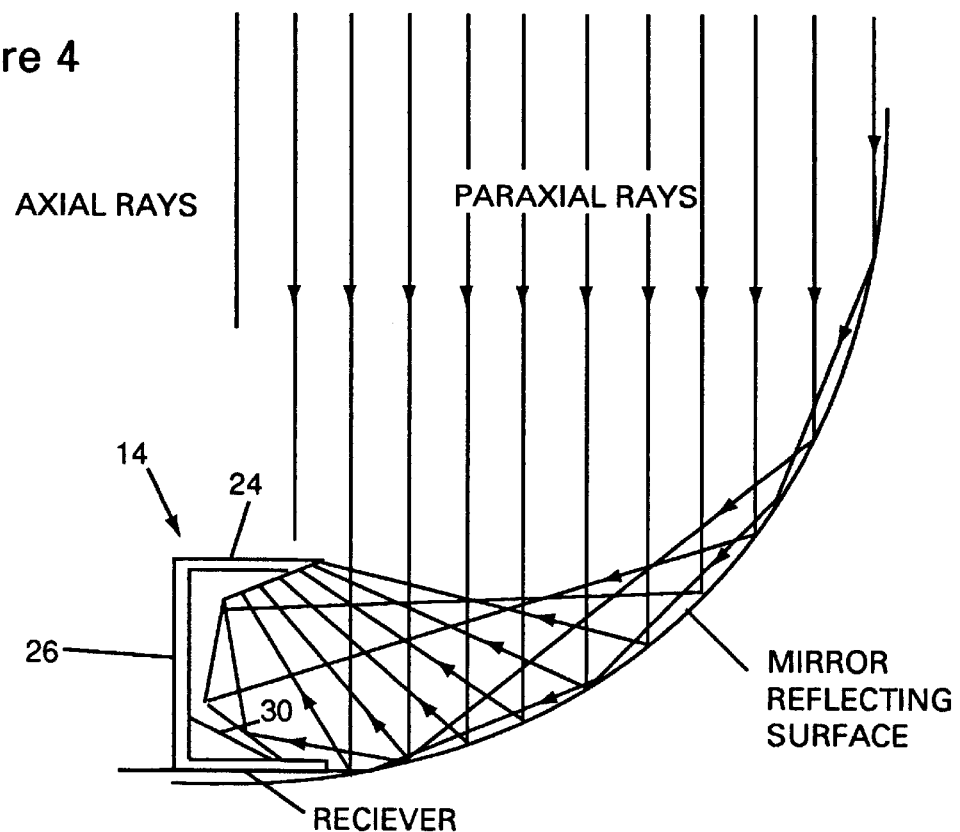
FIG. 4 is an illustration of the receiver of the present invention showing that solar energy is received across the entire device and not at a single hot spot.
Figure 5:
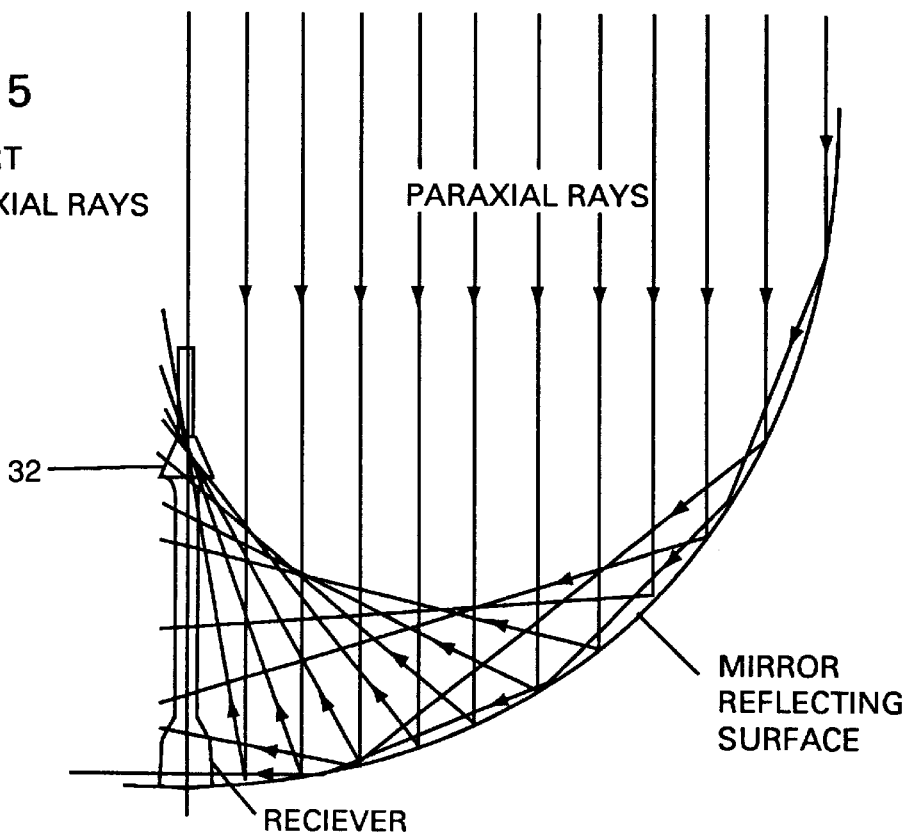
FIG. 5 is an illustration of a prior art receiver wherein it is shown that the majority of the solar energy is reflected to a single hot spot.

Referring now to FIG. 3, receiver 14 is disclosed in detail. Receiver 14 includes a top 24 and a support 26. Support 26 can be connected directly to movable platform 28. In a preferred embodiment, support 26 is connected to base 30. Top 24 is covered with a plurality of photovoltaic cells 25 of any known design. Additionally, in a preferred embodiment, support 26 is also covered with a plurality of photovoltaic cells 25 and base 30 is covered with a reflective surface 27, such as mirrors. In a preferred embodiment both the top 24, in the shape of an anvil, and the support 26 are covered with 20 to 1 concentrator cells 25. The inventor has found that this design shape solves the problem of eclipsing of the base 30 during summer noon, early morning, and late evening. Additionally, the base 30 with a reflective surface 27 also increases the flux densities along the lower support 26 where densities are typically lower. In order to provide optimum performance, some areas may require concentrator cells 25 of higher or lower ratios. In each unique application, these concentrator cell 25 ratios may be adjusted as necessary. Also, the inventor has determined that multiplier fins (not shown), as is known in the art, may be employed in lower flux zones or reflector bands (not shown), as known in the art, may be employed in hot bands. In any event, the inventor has found that the receiver 14 of the invention 10 when formed essentially in the shape of a block "C" as described above accomplishes the goal of providing solar flux densities of 20 to 1 over almost all of its interception surface. Unlike prior art devices, no single hot spot is created and a much more efficient receiver results. This is evidenced by reference to FIG. 4 where a ray tracing is illustrated showing receiver 14 receiving solar input across the length of its top 24 and support 26, as well as receiving reflected rays from the mirrored surface of base 30. By comparison, FIG. 5 illustrates the hot spot 32 common with prior art receivers.

Receiver 14 is designed so that each photovoltaic cell 25 receives approximately twenty suns. The top 24 of receiver 14 is in the shape of an anvil elongated so as to take into consideration the high incident ratios experienced near the top 24 of receiver 14. The receiver 14 further includes a frame to which photovoltaic cells 25 are connected. These photovoltaic cells 25 are cooled by means of water or air as is known in the art and not shown. The inventor has determined that optimum performance of receiver 14 occurs when the anvil top 24 begins when the height of support 26 and base 30 together are equal to 1−sin45 times the radius of the hemispheric solar reflector 12.

Figure 6:
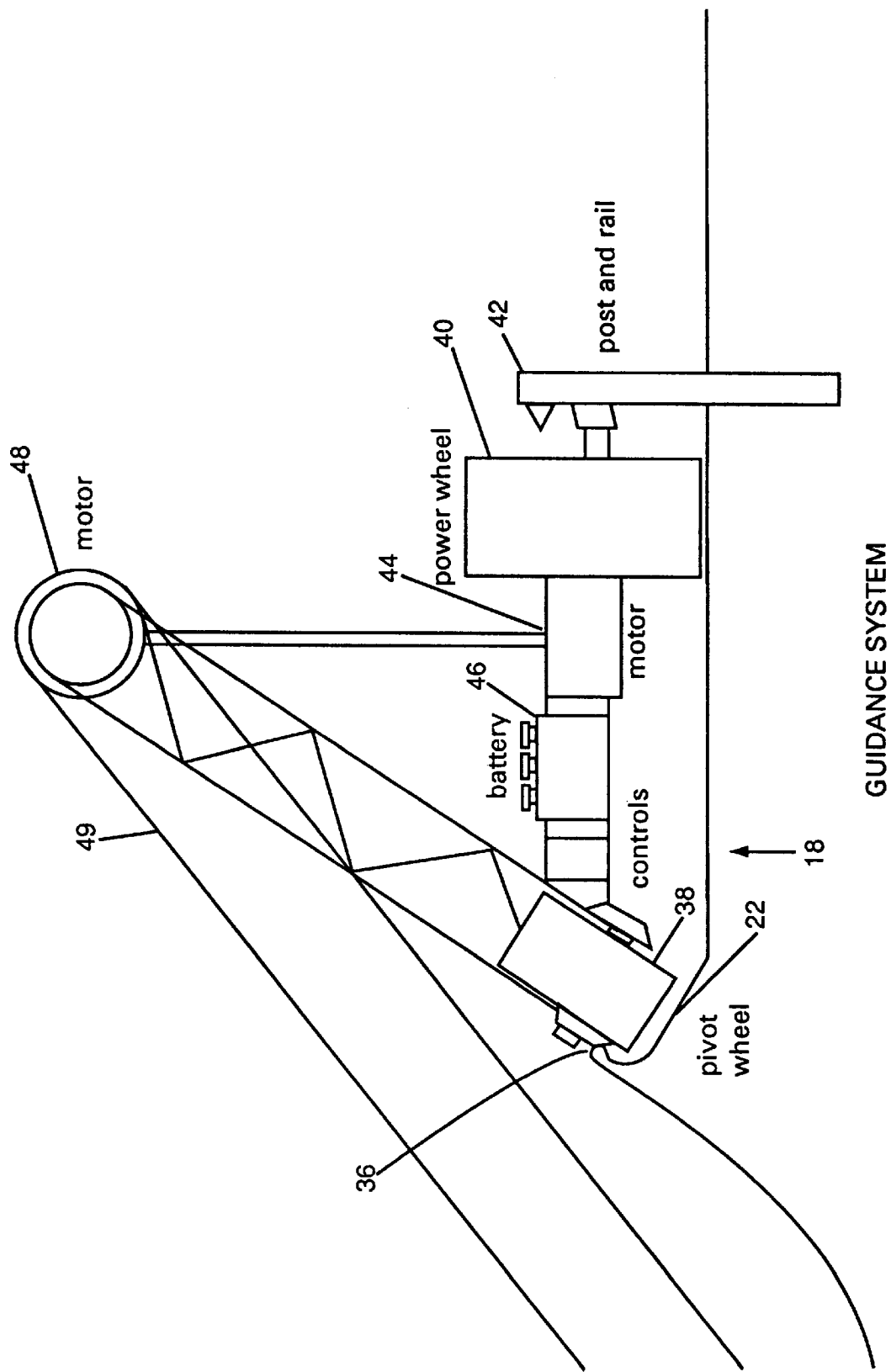
FIG. 6 is a side view of the guidance system of the present invention located at the rim of the hemispheric solar reflector.
Figure 9:
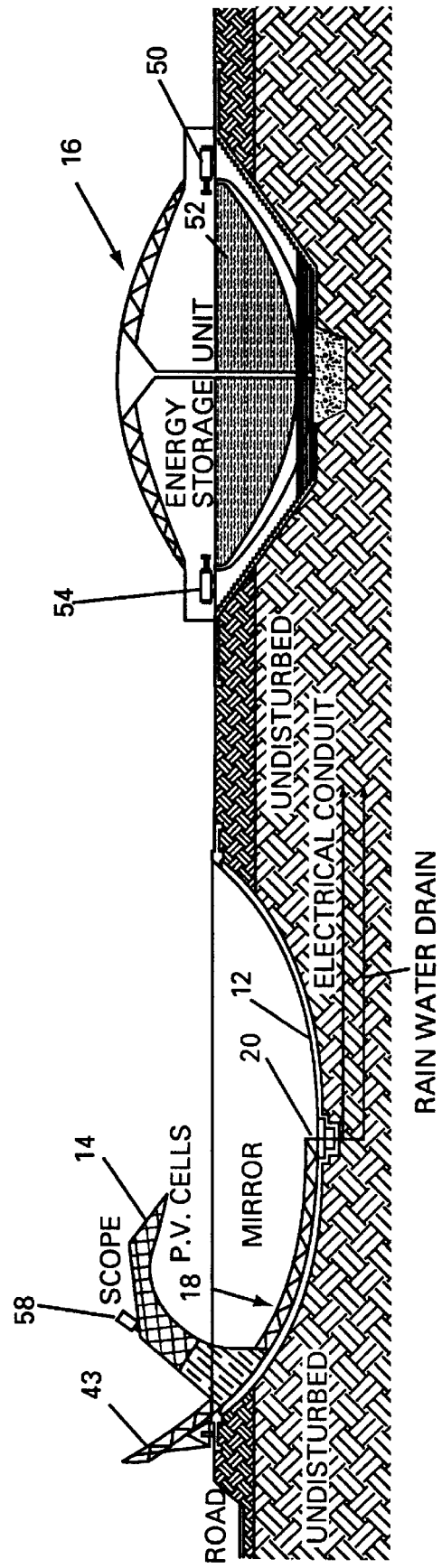
FIG. 9 is a side view of the hemispheric solar reflector together with the power conditioning device.
Figure 10:
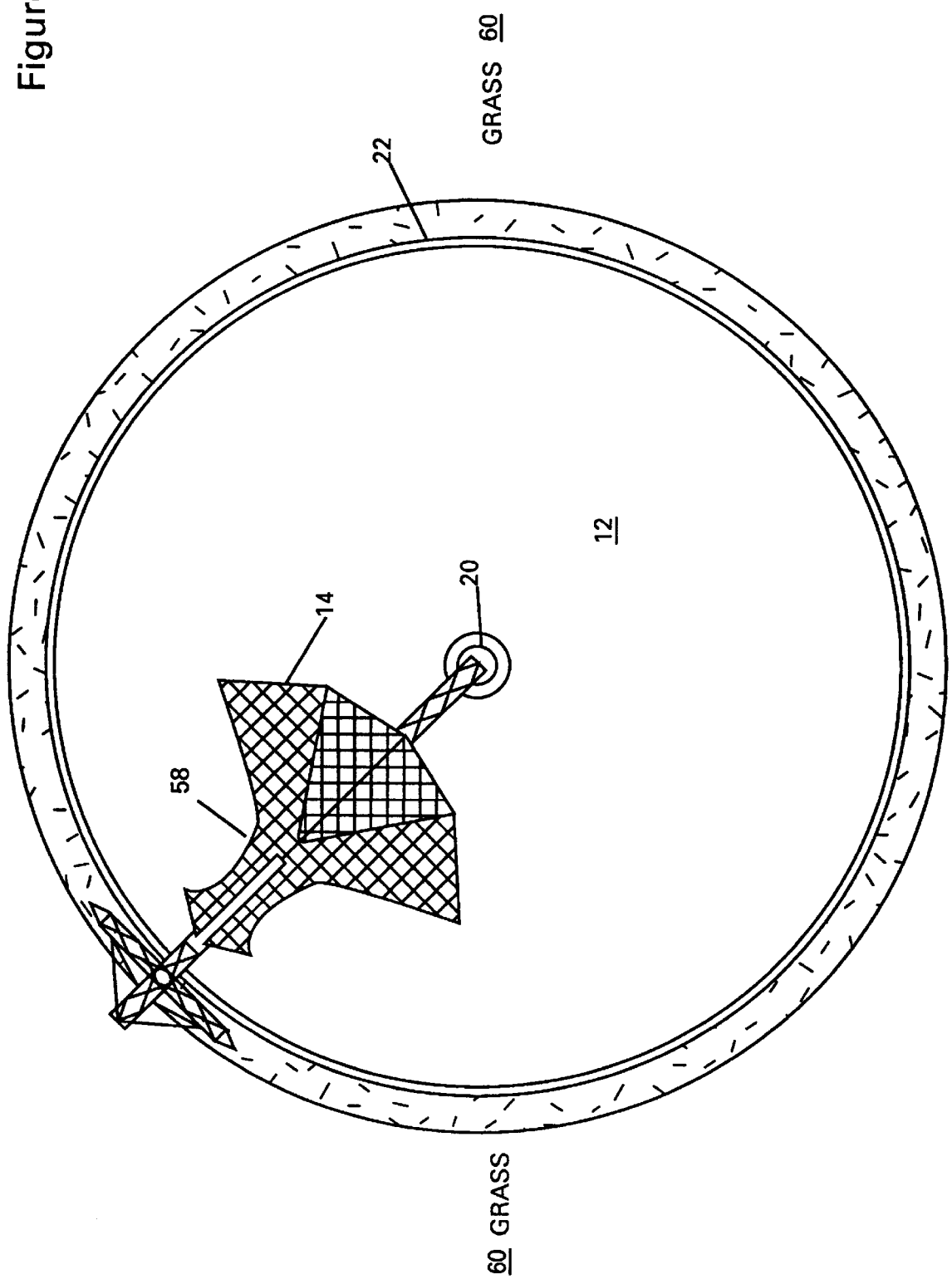
FIG. 10 is a top view of the hemispheric solar reflector and the hemispheric solar receiver.

Referring now to FIG. 6 guidance system 18 is illustrated. In a preferred embodiment guidance system 18 utilizes a curb 36 around the rim 22 of hemispheric solar reflector 12. Upon curb 36 pivot wheel(s) 38 is/are free to roll. Pivot wheel 38 is connected to power wheel 40 which is movably connected to rail 42. Power wheel 40 is driven by motor 44 which is powered by battery 46. Battery 46 also controls guidance motor 48 which raises and lowers receiver 14 into and out of hemispheric solar reflector 12 by means of cables 49 as also illustrated in FIG. 2. Motor 44 in conjunction with power wheel 40 enable movement of receiver 14 around the rim 22 of hemispheric solar reflector 12. Importantly, central pivot point 20 at the nadir of hemispheric solar reflector 12 anchors the guidance system 18 relative to hemispheric solar reflector 12. In another preferred embodiment cables 49 are replaced by a single rigid, pivoting, frame member or gantry 43 upon which receiver 14 moves as shown in FIGS. 1, 9 and 10. Gantry 43 also pivots around hemispheric solar reflector 12 rim 22 at point 20. In general, guidance system 18, is capable of withstanding significant forces from wind and does not require large amounts of parasitic power to operate. As shown in FIGS. 1 and 9, gantry 43 also extends above rim 22 thereby enabling receiver 14 to rise above the rim 22 so as to fully capture reflected solar rays.

Figure 7:
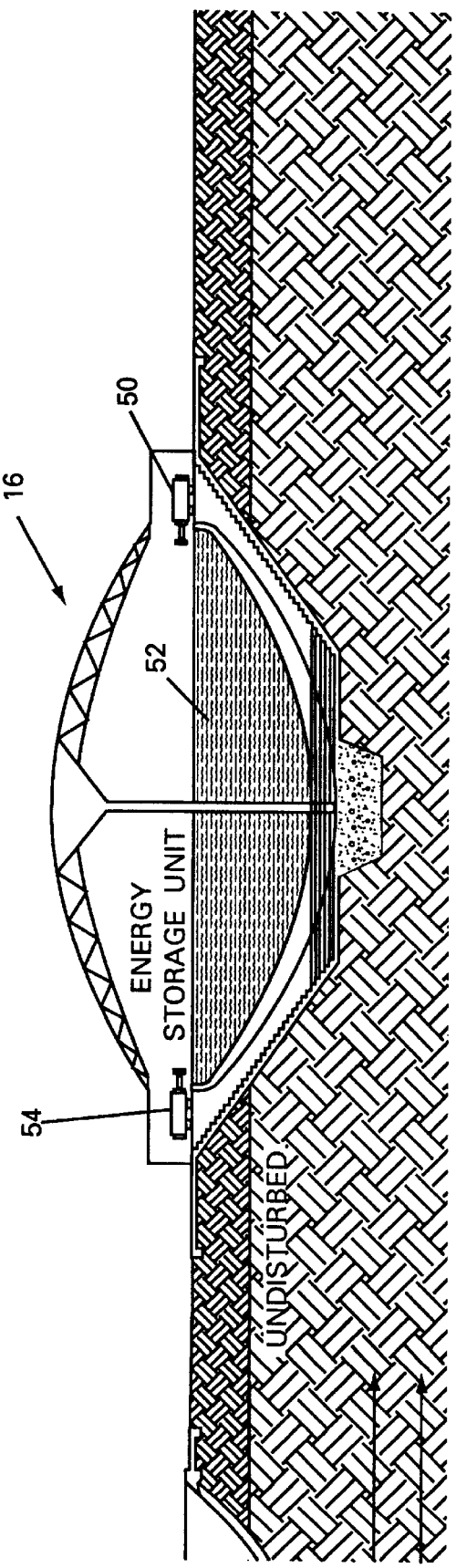
FIG. 7 is a side sectional view of the power conditioning device of the present invention.

Referring now to FIG. 7, power conditioner 16 receives power from receiver 14 at input motor 50. By means of flywheel 52 in combination with induction generator 54, similar to those employed in the wind industry, power is banked and converted later in the afternoon of a solar day, allowing for load following and off peak purchases. As is known in the art, power conditioner 16 may be dedicated to energy storage of various other types which include reversible fuel cells, hydrogen generation, compressed air storage, inertial flywheel storage and the like. As more fully discussed hereafter, in a preferred embodiment, one power conditioner 16 is connected to eight separate receivers 14 (See FIG. 8). This ratio allows for eight production modules (as the combination of hemispheric solar reflector 12 and receiver 14 may be described) to work in synthesis with its power conditioner 16. Also, in a preferred embodiment, the power conditioner 16 is naturally cooled and may include solid state or rotary invertors to convert the DC power of the photovoltaic cells to synchronous AC.

Figure 8:
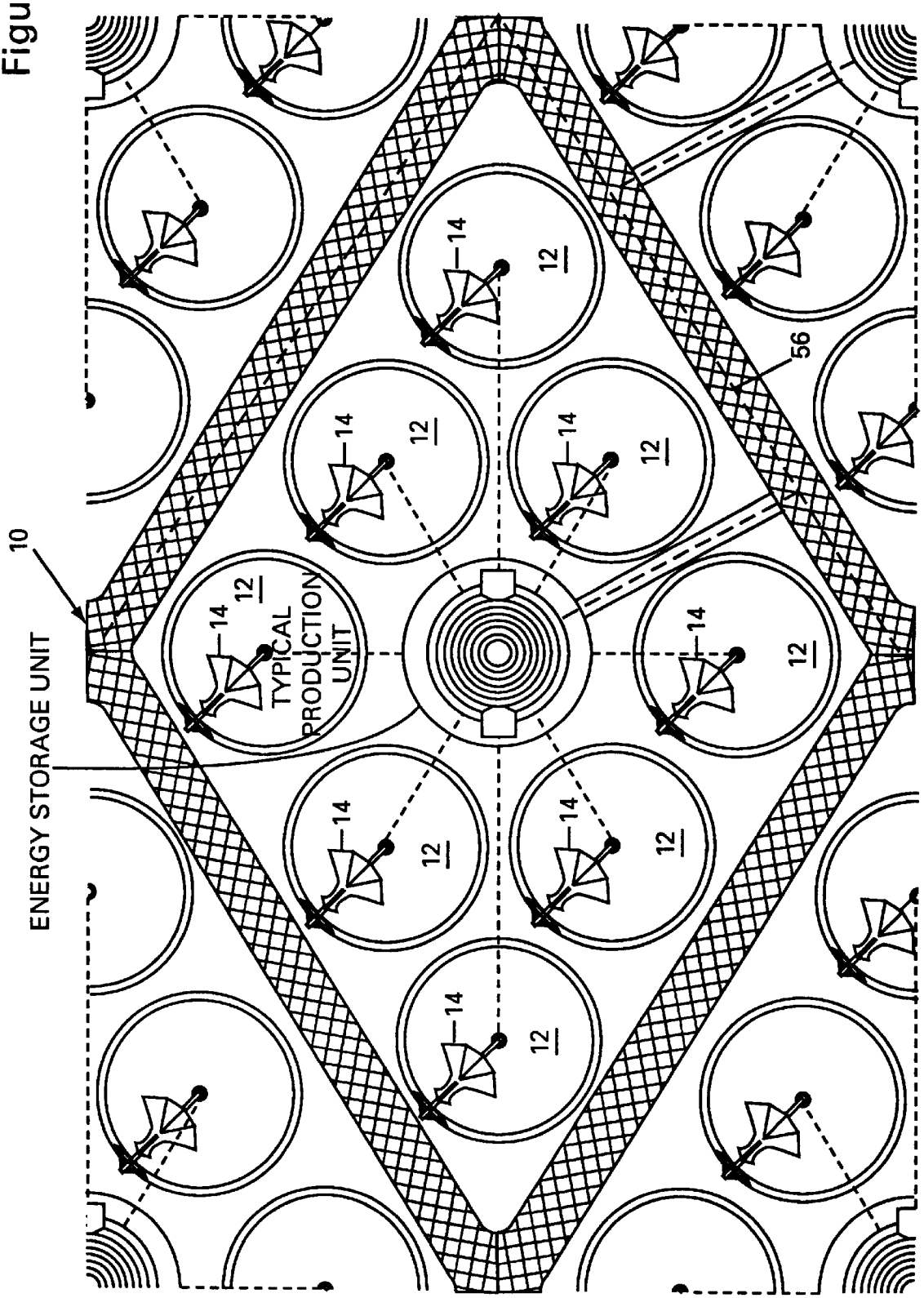
FIG. 8 is a top view of a preferred layout of the hemispheric moving focus power plant of the present invention.

Referring now to FIG. 8, a preferred embodiment of the hemispheric moving focus power plant method of the present invention is disclosed. FIG. 8 illustrates a "9-ball" rack of eight hemispheric solar reflectors 12 and one centrally located power conditioner 16. The centrally located power conditioner 16 of this embodiment is also capable of being used to house cooling water, reflector dish cleaning water, hydrogen/oxygen generators, fuel cells, gas or hydrogen turbines, or any other type of storage or use that might be appropriate for the renewable energy region in which the hemispheric moving focus power plant 10 must perform. FIG. 8 illustrates a design which allows all eight hemispheric solar reflectors 12 and receivers 14 access to diagonal turf roads 56. FIG. 9 is a side view showing the power conditioner 16 located next to one of the hemispheric solar reflectors 12. FIG. 10 is a top view of hemispheric solar reflector 12 and solar receiver 14.

Additionally, the inventor has determined that a significant advantage of the untilted hemispheric moving focus power plant 10 of the present invention is its ability to collect and capture incident rainfall. As a result, significant amounts of water are available for irrigation, potable water, cleaning and so forth. In a preferred embodiment, a simple water collection system of any type known in the art is provided for capturing the water collected in the hemispheric solar reflectors 12 and storing it for reuse. Captured water may be used for any desirable purpose as mentioned, such as watering glass 60 surrounding reflectors 12 and power conditioners 16.

By way of example, using 20 to 1 solar densities, a one-hundred twenty foot diameter hemispheric solar reflector 12 (11,300 square feet) requires a four-hundred square foot receiver 14. The resulting receiver 14 is thirty by fourteen feet and tracks the sun via the circumferential concrete rail system of guidance system 18 as disclosed above. This guidance system 18 is connected to central pivot point 20 at the nadir of hemispheric solar reflector 12 by a system of pulleys and cables 49 or gantry 43. As a result, the position of the receiver 14 is controllable within and above the rim 22 of hemispheric solar reflector 12. Assuming eighty percent (80%) of the hemispheric solar reflector 12 is utilized on average for each hour and day of the solar resource day, approximately nine thousand (9,000) square feet of solar flux is directed from a hemispheric solar reflector 12 of these dimensions to a receiver 14 as described above for up to ten hours a day. Average concentration ratios, the Applicant has determined, will be as high as 22 to 1. Cell efficiencies, therefore, approach twenty percent (20%). Average output then is approximately ninety kW. Peak daily output in a high resource location, therefore, will be approximately a megawatt hour per day.

As has been shown, Applicant's invention has fewer moving parts than prior art devices and is primarily a solid state device. As a result, maintenance and operating costs are minimized. Additionally since the majority of the reflection subsurface is manufactured on site, the hemispheric moving focus power plant 10 of the present invention is exportable in standard containers worldwide. Also, since the hemispheric solar reflector 12 is manufactured on site, the hemispheric moving focus power plant 10 of the present invention can meet any local content requirements. By using, as illustrated in FIG. 8, power conditioner 16 as a hydrogen-oxygen generator, hemispheric moving focus power plant 10 can provide marketable fuel in the form of hydrogen gas, electricity when the sun is shining, and fuel cell backup when it is not.

Importantly, since the hemispheric solar reflector 12 of the present invention is not tilted construction costs are minimized. Construction costs are further minimized because the need to achieve high concentrations of solar flux, as required by prior art technologies which require high quality optics, is eliminated. Applicant's hemispheric solar reflector 12 in a preferred embodiment is formed of concrete which is polished. If enhanced reflecting surfaces are desired or necessary, reflective paints and adhesive materials may be applied as is known in the art. In any event, no high quality optics or mirrors are required for utilization of Applicant's hemispheric moving focus power plant 10.

Additionally, Applicant's invention includes a sun scope 58 apparatus for use with guidance system 18. As is known in the art, sun scope 58 is utilized to automatically track the sun by way of movement of receiver 14 by means of guidance system 18 as described above. Automatic movement of the receiver 14 is insured unless and until overridden.

While the present invention has been disclosed in connection with the preferred embodiment thereof, it should be understood that there may be other embodiments which fall within the spirit and scope of the invention as defined by the following claims.

I claim:

1. A hemispheric moving focus power plant apparatus comprising:

(a) a hemispheric solar reflector means for reflecting solar energy;

(b) photovoltaic receiver means for receiving reflected solar energy and producing electrical power therefrom, said photovoltaic receiver means comprising a vertical center support stem, a top connected to said vertical center support stem and angling outwardly and upwardly at an acute angle from said vertical center support stem, said top and said vertical center support stem covered with a plurality of photovoltaic cells, and said photovoltaic receiver means is movably connected to said hemispheric solar reflector; and (c) a power conditioning means, connected to said photovoltaic receiver means, for receiving electrical power from said photovoltaic receiver means and conditioning said electrical power for use.

2. The apparatus of claim 1 wherein said hemispheric solar reflector means further comprises a hemispheric solar reflector which represents the arc required at a selected latitude so as to substantially avoid eclipsing.

3. The apparatus of claim 2 wherein the arc is ninety degrees and the latitude is thirty degrees.

4. The apparatus of claim 1 wherein said photovoltaic receiver means further comprises a top in the shape of an anvil.

5. The apparatus of claim 1 wherein said photovoltaic cells are 20 to 1 concentrator cells.

6. The apparatus of claim 1 further comprising a water collection means, for collecting water captured by said hemispheric solar reflector means.

7. The apparatus of claim 1 further comprising a guidance system for controllably moving the photovoltaic receiver means around said hemispheric solar reflector means and up and down a reflective surface of said hemispheric solar reflective means.

8. The apparatus of claim 7 wherein said guidance system further comprises a circumferential rail guide around said hemispheric reflector means and a central pivot point at the nadir of said hemispheric solar reflector means for controlling said photovoltaic receiver means around, in, or above said hemispheric solar reflector means.

9. The apparatus of claim 7 further comprising a sun scope for automatically seeking the sun unless overridden.

10. The apparatus of claim 1 wherein said power conditioning means is a solid state or rotary inverter to convert DC power from the photovoltaic cells to synchronous AC power.

11. The apparatus of claim 1 wherein said power conditioning means stores power for future consumption.

12. The apparatus of claim 11 wherein storage is in the form of one from a group including reversible fuel cells, hydrogen generation, compressed air storage, and inertial flywheel storage.

13. The apparatus of claim 1 further comprising a base connected to said vertical center support stem and angling outwardly and downwardly at an acute angle from said vertical center support stem, said base covered with reflective means for reflecting solar energy onto said photovoltaic receiver means.

14. The apparatus of claim 13 wherein the acute angle of the and base sections is twenty-two degrees and the photovoltaic cells are 20 to 1 concentrator cells.

15. A hemispheric moving focus power plant method comprising the steps of:
   (a) constructing the hemispheric solar reflector means for reflecting solar energy;
   (b) movably attaching a photovoltaic receiver means for receiving reflected solar energy and producing electrical power therefrom to said hemispheric solar reflector means, said photovoltaic receiver means comprising a vertical center support stem, a top connected to said vertical center support stem and angling outwardly and upwardly at an acute angle from said vertical center support stem, said top and said vertical center support stem covered with a plurality of photovoltaic cells; and
   (c) connecting a power conditioning means to said photovoltaic receiver means, for receiving electrical power from said photovoltaic receiver means and conditioning said electrical power for use.

16. The method of claim 15 further comprising the step of providing a guidance system for controllably moving the photovoltaic receiver means around said hemispheric solar reflector means and up and down a reflective surface of said hemispheric solar reflector means.

17. The method of claim 15 wherein the step of constructing a hemispheric solar reflector further comprises the step of constructing a square with three hemispheric solar reflector means to a side and one power converting means in the center of said square to which all eight photovoltaic receiver means are connected.

* * * * *